United States Patent
Ma

(10) Patent No.: US 11,282,533 B2
(45) Date of Patent: Mar. 22, 2022

(54) DISTORTION REDUCING MULTI-BAND COMPRESSOR WITH DYNAMIC THRESHOLDS BASED ON SCENE SWITCH ANALYZER GUIDED DISTORTION AUDIBILITY MODEL

(71) Applicant: DOLBY LABORATORIES LICENSING CORPORATION, San Francisco, CA (US)

(72) Inventor: Yuanxing Ma, Beijing (CN)

(73) Assignee: Dolby Laboratories Licensing Corporation, San Francisco, CA (US)

(*) Notice: Subject to any disclaimer, the term of this patent is extended or adjusted under 35 U.S.C. 154(b) by 0 days.

(21) Appl. No.: 17/281,006

(22) PCT Filed: Sep. 26, 2019

(86) PCT No.: PCT/US2019/053142
§ 371 (c)(1),
(2) Date: Mar. 29, 2021

(87) PCT Pub. No.: WO2020/069120
PCT Pub. Date: Apr. 2, 2020

(65) Prior Publication Data
US 2021/0343308 A1    Nov. 4, 2021

Related U.S. Application Data

(60) Provisional application No. 62/798,149, filed on Jan. 29, 2019.

(30) Foreign Application Priority Data

Sep. 28, 2018 (WO) ............... PCT/CN2018/108287
Feb. 4, 2019 (EP) ..................... 19155298

(51) Int. Cl.
*G10L 21/034* (2013.01)
*G10L 21/0364* (2013.01)
(Continued)

(52) U.S. Cl.
CPC ........ G10L 21/034 (2013.01); G10L 21/0364 (2013.01); G10L 25/18 (2013.01);
(Continued)

(58) Field of Classification Search
CPC ... G10L 21/034; G10L 21/0364; G10L 25/18; G10L 25/21; G10L 25/51; G10L 19/0204;
(Continued)

(56) References Cited

U.S. PATENT DOCUMENTS 4,099,035 A * 7/1978 Yanick ................. H03G 9/025
381/106
9,031,834 B2 5/2015 Coorman
(Continued)

FOREIGN PATENT DOCUMENTS

CN    102684628 B    11/2014
CN    105556837 B    4/2019
(Continued)

OTHER PUBLICATIONS

Hamacher, V. et al. "Signal Processing in High-End Hearing Aids: State of the Art, Challenges, and Future Trends" EURASIP Journal on Applied Signal Processing, 2005, pp. 2915-2929.

*Primary Examiner* — Leshui Zhang

(57) ABSTRACT

The present application relates to a method, system, and computer program product of dynamically adjusting thresholds of a compressor responsive to an input audio signal. A scene switch analyzer receives an input audio signal having a plurality of frequency band components. The scene switch analyzer determines whether a scene switch has occurred in the input audio signal. The frequency band components of
(Continued)

the input audio signal are processed. In response to determine that scene switch has not occurred, a distortion audibility system applies slow smoothing to compressor thresholds of the frequency band components. In response to determine that scene switch has occurred, the distortion audibility system applies fast smoothing or no smoothing to the compressor thresholds of the frequency band components.

13 Claims, 5 Drawing Sheets

(51) Int. Cl.
*G10L 25/18* (2013.01)
*G10L 25/21* (2013.01)
*G10L 25/51* (2013.01)
*H03G 9/18* (2006.01)

(52) U.S. Cl.
CPC .............. *G10L 25/21* (2013.01); *G10L 25/51* (2013.01); *H03G 9/18* (2013.01)

(58) Field of Classification Search
CPC ........ G10L 21/0232; H03G 9/18; H03G 3/30; H03G 9/025; H03G 7/002; H04R 25/356; H04R 3/007
USPC ........ 381/55, 56, 60, 320, 321, 72, 73.1, 74, 381/86, 334, 91, 92, 95, 97–104, 106, 381/107, 108, 109, 110, 111, 112–115, 381/118, 119, 120, 121, 122, 123; 700/94; 379/347, 388.03, 390.01, 390.03
See application file for complete search history.

(56) References Cited

U.S. PATENT DOCUMENTS

| | | | |
|---|---|---|---|
| 9,304,988 B2 | 4/2016 | Terrell | |
| 9,307,340 B2 | 4/2016 | Seefeldt | |
| 9,419,577 B2 | 8/2016 | Seefeldt | |
| 9,619,199 B2* | 4/2017 | Koppens | ............. G10L 21/0324 |
| 9,654,876 B2 | 5/2017 | Neely | |
| 9,672,834 B2 | 6/2017 | Pandey | |
| 9,673,770 B2 | 6/2017 | Vickers | |
| 9,762,198 B2 | 9/2017 | Seefeldt | |
| 9,779,721 B2 | 10/2017 | Donjon | |
| 9,935,599 B2 | 4/2018 | Seefeldt | |
| 2004/0083094 A1 | 4/2004 | Zelazo | |
| 2009/0220109 A1* | 9/2009 | Crockett | ................. H03G 9/005 |
| | | | 381/107 |
| 2010/0124339 A1* | 5/2010 | Turnbull | ................. H04R 3/005 |
| | | | 381/86 |
| 2010/0142729 A1* | 6/2010 | Noguchi | ................... H04S 7/00 |
| | | | 381/107 |
| 2012/0278087 A1 | 11/2012 | Hosokawa | |
| 2012/0321096 A1 | 12/2012 | Crockett | |
| 2015/0270819 A1* | 9/2015 | Seefeldt | ................... H04R 3/04 |
| | | | 700/94 |
| 2015/0332685 A1* | 11/2015 | Bleidt | ................... G10L 19/012 |
| | | | 704/500 |
| 2016/0072467 A1* | 3/2016 | Seefeldt | ................. H03G 5/165 |
| | | | 381/94.3 |
| 2017/0061982 A1 | 3/2017 | Pakarinen | |
| 2018/0136899 A1 | 5/2018 | Risberg | |

FOREIGN PATENT DOCUMENTS

| | | | | |
|---|---|---|---|---|
| CN | 107534820 B | | 9/2020 | |
| EP | 2899883 B1 | | 7/2016 | |
| JP | 2004191821 A | * | 7/2004 | ............. G10L 19/00 |
| JP | 2004191821 A | | 7/2004 | |
| JP | 2010136173 A | | 6/2010 | |
| WO | 2014179021 | | 11/2014 | |

* cited by examiner

DISTORTION REDUCING MULTI-BAND COMPRESSOR WITH DYNAMIC THRESHOLDS BASED ON SCENE SWITCH ANALYZER GUIDED DISTORTION AUDIBILITY MODEL

CROSS-REFERENCE TO RELATED APPLICATIONS

This application claims the benefit of priority to International Patent Application No. PCT/CN2018/108287 filed on 28 Sep. 2018; U.S. Provisional Patent Application No. 62/798,149, filed 29 Jan. 2019, and European Patent Application No. 19155298.3 filed 4 Feb. 2019, all of which are hereby incorporated by reference in their entirety.

TECHNICAL FIELD

The present application disclosure generally relates to audio presentation and, in particular, to distortion reduction during presentation.

BACKGROUND

Many audio playback systems contain amplifiers and speakers with limited output capabilities. Mobile phones and tablets are two extreme examples where the design is rigidly limited by the dimension and power requirements of the device. In such systems it is common for the audio to distort as the playback level is increased, and oftentimes the characteristics of this distortion are frequency dependent. Therefore, it is common practice to apply multi-band compression to the audio signal prior to playback to reduce distortion and attempt to maximize playback level on a playback device. A distortion threshold is specified for each frequency band of the signal, and a compressor applies an independent gain to each band to ensure that the signal level in each band does not exceed the corresponding distortion threshold. A problem with such a compressor is that the gains applied for the purposes of distortion reduction might be content dependent. The thresholds set in order to eliminate perceived distortion for a narrowband signal are oftentimes more than what is required for broadband signals, since the broadband signal itself may significantly mask some of the distortion which it induces whereas a narrowband signal may be much less effective at masking its induced distortion. To address this problem, the applicant proposed the multiband compressor augmented with a distortion audibility model that gives audibility measure which is then utilized to dynamically modify the thresholds of the compressor to achieve maximum playback level with minimal perceived distortion, as illustrated in FIG. 1.

SUMMARY

The present application introduces a scene switch analyzer, to determine if a scene switch has occurred in the input audio signal, to guide the distortion audibility model. This scene switch analyzer makes sure that the rapid change of compressor thresholds only happens at the same moment as the scene switches, so as to give a more natural experience. Generally, a scene switch occurs when a paragraph of content is comprised of narrowband signals, and the following paragraph is comprised of broadband signals, or vice versa. For example, if the vocal comes in after a piano solo, it is considered as a scene switch, thus the compressor thresholds could change rapidly as the distortion audibility measure changes. A scene switch also occurs when one piece of content is comprised of narrowband signals, and the next piece of content in the playlist is comprised of broadband signals, or vice versa. For example, a low-quality narrowband user-generated content (UGC) is followed by a professional broadband content.

Hence, when there is no scene switch in the input audio signal, slow smoothing of the dynamic compressor thresholds is applied such that they change slowly. This can be obtained by using a large attack time constant and/or release time constant of a one pole smoother used for the smoothing. When a scene switch is detected, fast smoothing is applied to allow for a rapid change of the compressor thresholds by using a smaller attack time constant and/or release time constant of the smoother.

In some implementations, a scene switch analyzer receives an input audio signal having a plurality of frequency band components. The scene switch analyzer determines whether a scene switch has occurred in the input audio signal. The frequency band components of the input audio signal are processed. In response to determining that scene switch has not occurred, a distortion audibility model applies slow smoothing to compressor thresholds of the frequency band components. In response to determining that scene switch has occurred, the distortion audibility model applies fast smoothing or no smoothing to the compressor thresholds of the frequency band components.

In some implementations, the scene switch includes a switch between a broadband signal and a narrowband signal, or vice versa. The broadband signal corresponds to a vocal sound or a professional movie content, and the narrowband signal corresponds to an instrumental sound, e.g., a piano sound or a low-quality narrowband UGC content.

In some implementations, determining whether a scene switch has occurred in the input audio signal is based on all frequency band components of an input audio signal. For example, determining whether a scene switch has occurred in the input audio signal is based on a time-varying estimation of the centroid of or the estimation of the cutoff band of the signal power spectrum by smoothing each frequency band component signal. Specifically, the scene switch analyzer computes the time-varying estimation of the signal power spectrum centroid by performing operation including estimating a signal power spectrum by smoothing each frequency band component signal and determining the centroid of the signal power spectrum using the estimated signal power spectrum. Determining whether the scene switch has occurred in the input audio signal can include the following operations: smoothing the centroid; determining a difference between the centroid and the smoothed centroid; and determining whether the scene switch has occurred based on whether the difference satisfies a threshold. In addition, the scene switch analyzer computes the estimation of the cutoff band of the signal power spectrum at least by performing operations including estimating a signal power spectrum by smoothing each frequency band component signal and determining the cutoff band of the signal power spectrum using the estimated signal power spectrum. Determining whether the scene switch has occurred in the input audio signal can include the following operations: smoothing the cutoff band; determining a difference between the cutoff band and the smoothed cutoff band; and determining whether the scene switch has occurred based on whether the difference satisfies a threshold.

In some implementations, the scene switch analyzer provides one or more control signals to the distortion audibility model to guide the smoothing to compressor thresholds of the frequency band components of the input audio signal after determining whether the scene switch has occurred. In addition, in some implementations, one or more control signals guide the change of the time constants including attack time constant and/or release time constant. In some implementations, the function of one or more control signals is mapped to the range [0, 1], which can be the step function or the sigmoid function.

In some implementations, a scene switch analyzer for determining whether a scene switch has occurred in the input audio signal includes one or more computing devices operable to cause some or all of the operations described above to be performed.

In some implementations, a computer-readable medium stores instructions executable by one or more processors to cause some or all of operations described above to be performed.

BRIEF DESCRIPTION OF THE FIGURES

The included Figures are for illustrative purposes and serve only to provide examples of possible and operations for the disclosed inventive methods, system and computer-readable medium. These figures in no way limit any changes in form and detail that may be made by one skilled in the art without departing from the spirit and scope of the disclosed implementations.

DETAILED DESCRIPTION

As above mentioned, now, the multiband compressor augmented with a distortion audibility model is used to give audibility measure which is then utilized to dynamically modify the thresholds of the compressor to achieve maximum playback level with minimal perceived distortion. A plurality of dynamic (time-varying) thresholds are determined according to the plurality of frequency band components, wherein each time-varying threshold corresponds to a respective frequency band component. The compressor then performs a compression operation on each frequency band component, wherein the compression has the corresponding time-varying threshold to produce a gain for each frequency band component. However, the problem with such a distortion audibility model augmented compressor is that when applied to mobile devices, whose dimensions are rigidly limited, the perceived distortion for a narrowband signal is harder to eliminate, thus the threshold set for narrowband signals is oftentimes much lower than that is required for broadband signals. That means a small change in distortion audibility measure will cause a large threshold change, resulting in considerable output volume change. When the rapid and remarkable change occurs at unexpected moments, it will have a negative impact on listening experience.

To address this problem, the present application discloses techniques that incorporate a scene switch analyzer configured to guide a distortion audibility model to smooth the dynamic (time-varying) thresholds, which can be applied by a multi-band compressor. Some examples of methods, systems and computer-readable medium implementing said techniques for dynamically adjusting the thresholds of a compressor responsive to an input audio signal are disclosed as follows.

Figure 1:
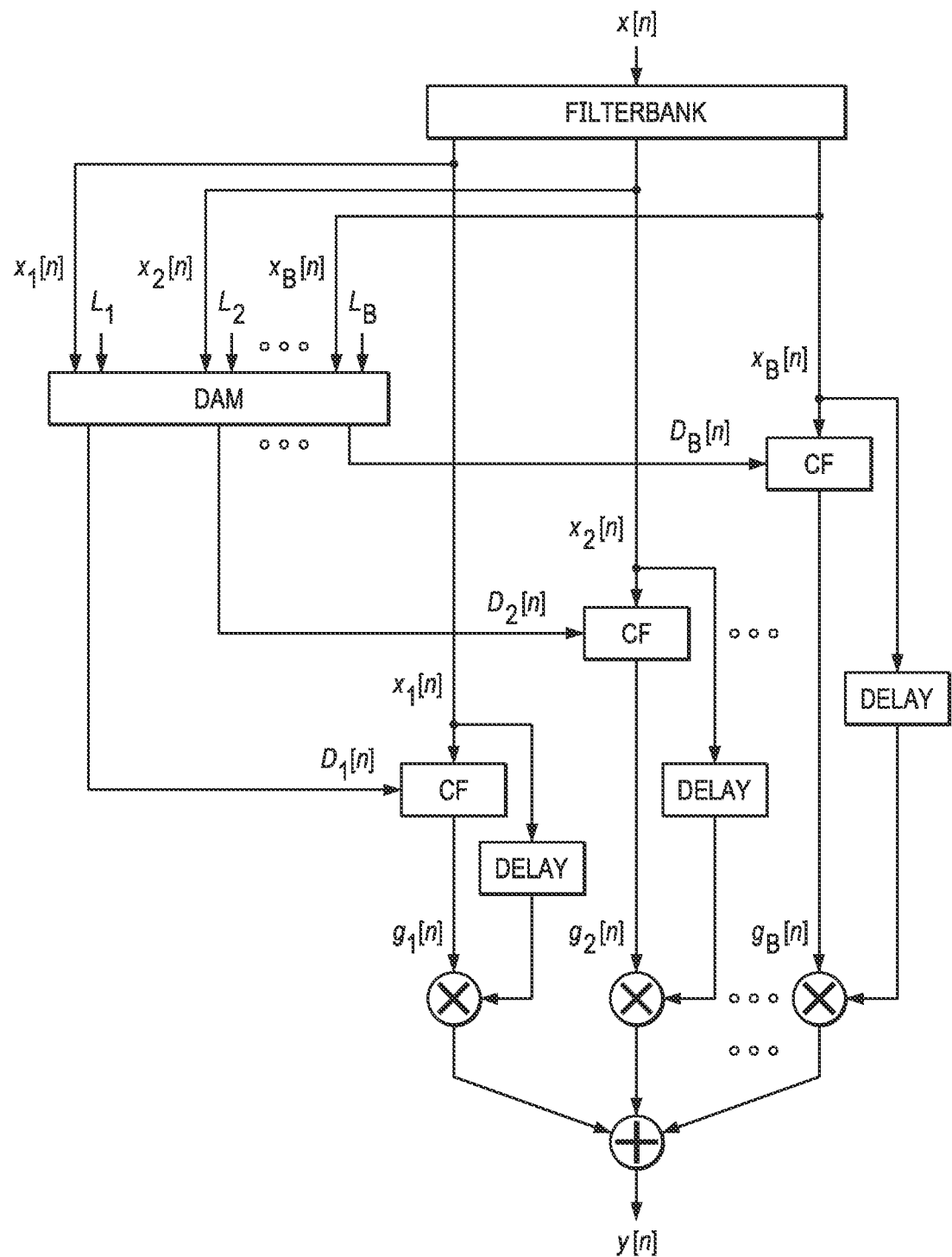
FIG. 1 shows a schematic view of a prior compressor incorporating a distortion audibility model (DAM) for dynamically adjusting thresholds of the compressor responsive to in input audio signal.
Figure 2:
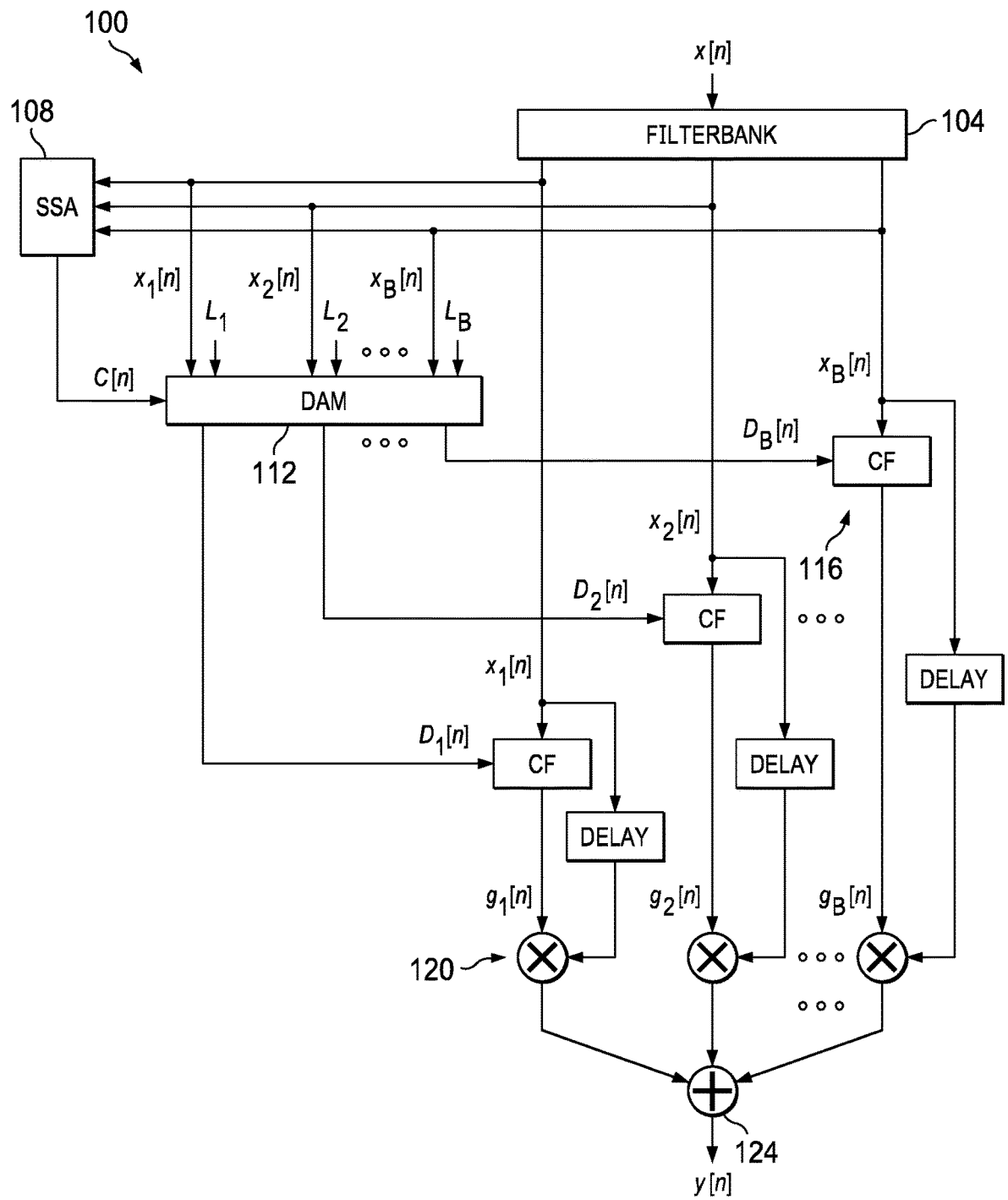
FIG. 2 shows a schematic view of a compressor 100 incorporating a scene switch analyzer (SSA) to guide a distortion audibility model (DAM) dynamically adjusting thresholds of the compressor responsive to an input audio signal, according to some implementations.

FIG. 2 depicts the multi-band compressor 100 incorporating a scene switch analyzer (SSA) to guide a distortion audibility model (DAM) dynamically adjusting thresholds of the compressor responsive to an input audio signal, according to some implementations. In FIG. 2, a filtering module in the form of a filterbank 104 receives an input signal x[n]. Filterbank 104 is configured to filter input signal x[n] to separate input signal x[n] into a number of frequency band components $x_1[n]$–$x_B[n]$. In some implementations, filterbank 104 is configured as a multi-band filter implemented as a number B of bandpass filters, where each bandpass filter corresponds to a respective frequency band component. For example, the output of each band b may be computed as the input signal x[n] convolved with a bandpass filter response $h_b[n]$ as represented in Equation (1):

$$x_b[n]=h_b[n]*x[n], b=1 \ldots B \qquad (1)$$

In FIG. 2, a scene switch analyzer 108 receives the frequency band components $x_1[n]$–$x_B[n]$ output from filterbank 104; and based on its analysis, a scene switch analyzer 108 creates one or more control signals $C_k[n]$. In some implementations, $C_k[n]$ is computed, potentially, as a function of all band signals $x_b[n]$ across bands b=1 . . . B, as represented in Equation (2):

$$C_k[n]=SSA(\{x_i[n]|i=1 \ldots B\}), \qquad (2)$$

Next, one or more control signals $C_k[n]$ are fed into a distortion audibility model 112 to guide it to compute each time-varying threshold $D_b[n]$ based on all frequency band components $x_1[n]$–$x_B[n]$ and fixed thresholds $L_b$ across bands b=1 . . . B, as represented in Equation (3):

$$D_b[n]=DAM(\{x_i[n],L_i,C_k[n]|i=1 \ldots B\}) \qquad (3)$$

Wherein, in some implementations, a scene switch analyzer 108 can create only one control signal to guide computing all time-varying thresholds $D_b[n]$ for all frequency band components $x_1[n]$–$x_B[n]$; in some other implementations, rather than only one control signal, a scene switch analyzer 108 can create a plurality of control signals to guide computing all time-varying thresholds $D_b[n]$ for all frequency band components $x_1[n]$–$x_B[n]$, for example, the number of the control signals correspond to the number of the frequency band components. Next, each frequency band component is passed into a compression function 116 along with the limit thresholds $D_b[n]$ to create the time-varying gains $g_b[n]$, as represented in Equation (4):

$$g_b[n]=CF(x_b[n],D_b[n])\qquad(4)$$

Finally, the processed output signal y[n] is computed by summing delayed versions of all of frequency band components $x_1[n]$-$x_B[n]$ multiplied with their corresponding gains $g_1[n]$-$g_B[n]$. In FIG. 2, the multiple units 120 are configured to multiple the gains with delayed frequency band components to produce the processed band components $y_1[n]$-$y_B[n]$, which are summed at a summing unit 124 to produce output signal y[n]. For example, a delay d can be designed to take into account any processing delay associated with the computation of the gains. Equation (5) shows a representation of the generation of processed signal y[n]:

$$y[n]=\sum_{b=1}^{B}g_b[n]x_b[n-d]\qquad(5)$$

Figures 3, 4:
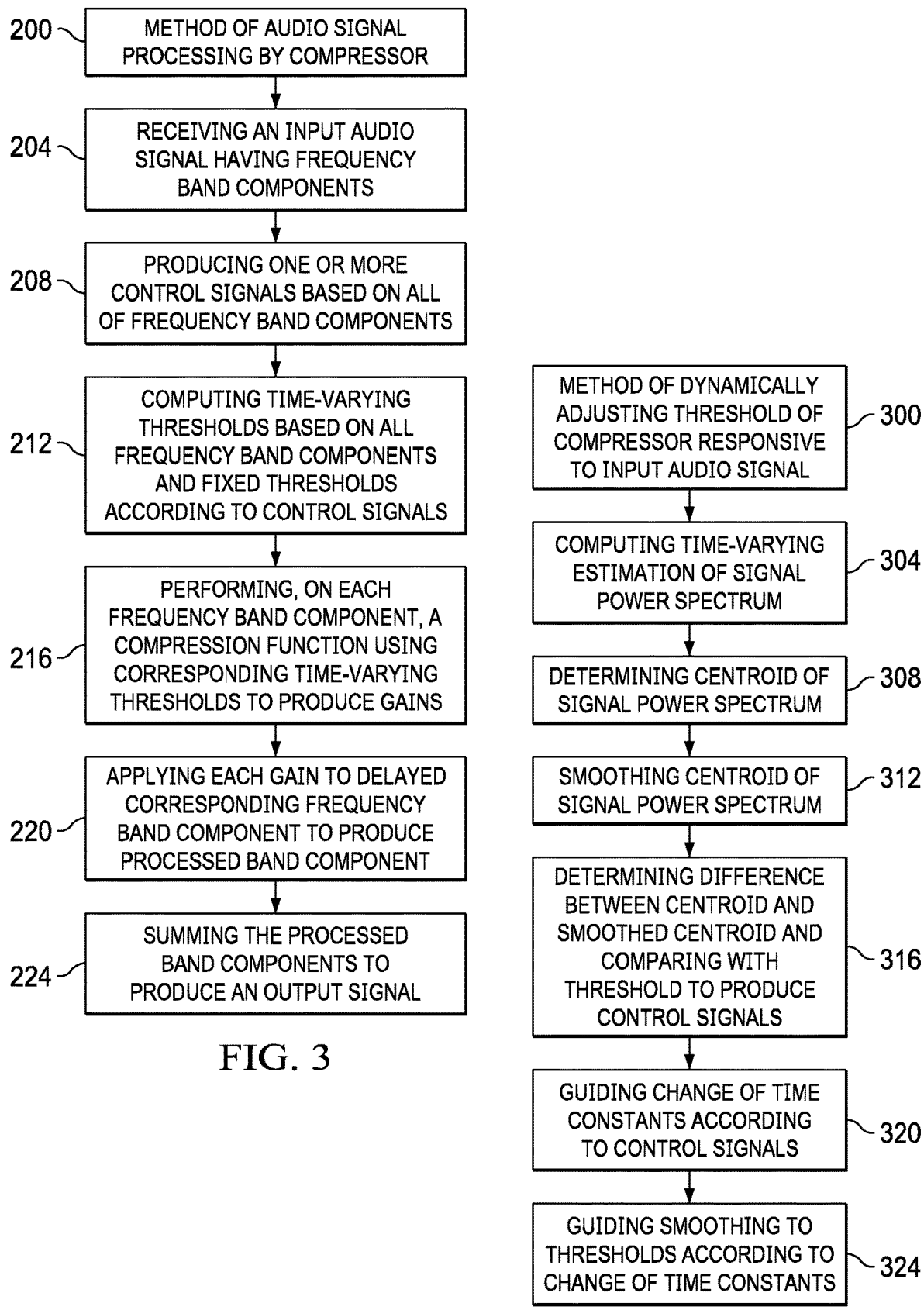
FIG. 3 shows a flow chart of a method 200 of audio signal processing by a compressor 100 disclosed herein, performed according to some implementations.
FIG. 4 shows an example of a method 300 of dynamically adjusting thresholds of the compressor responsive to in input audio signal based on determining whether a scene switch has occurred in the input audio signal, performed according to some implementations.

FIG. 3 shows a flow chart of a method 200 of audio signal processing by a compressor 100 disclosed herein, performed according to some implementations. FIG. 3 is described with the example of FIG. 2. At 204 of FIG. 3, the frequency band components $x_1[n]$-$x_B[n]$ are received as inputs to SSA 108, as explained above. At 208, SSA 108 produces one or more control signals $C_k[n]$ based on all of frequency bands components $x_1[n]$-$x_B[n]$. At 212, DAM 112 computes the time-varying thresholds $D_b[n]$ based on all frequency band components $x_1[n]$-$x_B[n]$ and fixed thresholds across bands according to the control signals $C_k[n]$. At 216, each compression function 116 is configured to perform a compression operation on corresponding frequency band components $x_1[n]$-$x_B[n]$ using corresponding time-varying thresholds $D_b[n]$ to produce gains $g_1[n]$-$g_B[n]$. At 220, each gain $g_b[n]$ is applied to a delayed version of each corresponding frequency band component $x_b[n]$, for instance, using multiplier units 120, to produce processed band components $y_1[n]$-$y_B[n]$. At 224, processed band components $y_1[n]$-$y_B[n]$ are summed at summing unit 124 to produce output signal y[n].

Therefore, rather than solely decided by DAM, SSA will also take the frequency band components $x_1[n]$-$y_B[n]$, and based on its analysis give one or more control signals $C_k[n]$ to control DAM to guide the smoothing to $D_b[n]$. For example, $C_k[n]$ guides the change of the time constants, which could give smaller time constants during a scene switch, to allow rapid changes, and give larger time constants when there is not a scene switch, to smooth out the fluctuations, since the attack and release time constants of a typical fast-attack/slow-release one pole smoother for $D_b[n]$ applied by the prior compressor would be fixed.

FIG. 4 shows an example of a method 300 of dynamically adjusting thresholds of the compressor responsive to input audio signal based on determining whether a scene switch has occurred in the input audio signal, performed according to some implementations. Preferably, it is found that the centroid of the signal power spectrum could be a good indicator of the scene switch cases, especially like when the vocal comes in after a piano-solo, or vice versa. Therefore, in this exemplary embodiment, a scene switch analyzer 108 operates by computing a time-varying estimation of the signal power spectrum centroid. At 304, the signal power spectrum $s_b[n]$ may be estimated by smoothing the per-band signal, i.e., each frequency band component signal $x_b[n]$ with a fast-attack/slow-release one pole smoother, as represented in Equation (6):

$$s_b[n]=\begin{cases}\alpha_A s_b[n-1]+(1-\alpha_A)x_b^2[n], & x_b^2[n]\geq s_b[n-1]\\ \alpha_R s_b[n-1]+(1-\alpha_R)x_b^2[n], & \text{otherwise}\end{cases}\qquad(6)$$

Where $\alpha_A$ is the attack time constant and an is the release time constant of a fast-attack/slow-release one pole smoother. This signal power spectrum $s_b[n]$ is then represented in dB, in Equation (7):

$$S_b[n]=10\log_{10}(s_b[n])\qquad(7)$$

Next, at 308, the centroid of the signal power spectrum C[n] is determined by the estimated signal power spectrum, as represented in Equation (8):

$$C[n]=\frac{\sum_b(S_b[n]+130)f_b}{\sum_b(S_b[n]+130)}\qquad(8)$$

wherein $f_b$ is the center frequency of the band and, preferably, the fixed offset 130 dB is chosen so that all potentially audible signal, generally louder than −130 dB, would be counted into the signal power spectrum. Then, at 312, the centroid of the signal power spectrum would also be smoothed with a fast-attack/slow-release one pole smoother to obtain the smoothed version centroid $C_s[n]$, as represented in Equation (9):

$$C_s[n]=\begin{cases}\alpha_A C_s[n-1]+(1-\alpha_A)C[n], & C[n]\geq C_s[n-1]\\ \alpha_R C_s[n-1]+(1-\alpha_R)C[n], & \text{otherwise}\end{cases}\qquad(9)$$

Next, at 316, the difference between the centroid C[n] and the smoothed centroid $C_s[n]$ is determined and then compared with the threshold, preferably, the threshold of 500 Hz is chosen which is effective to indicate the occurrence of scene switch, to produce one or more control signals $C_k[n]$, which could be mapped to the range [0, 1], as represented in Equation (10):

$$C_k[n]=f(C[n]-C_s[n])\qquad(10)$$

At 320, $C_k[n]$ guides the change of the time constants, such as, the attack time constant aa, as represented in Equation (11):

$$\alpha_A=C_k[n]\alpha_{Afast}+(1-C_k[n])\alpha_{Aslow}\qquad(11)$$

Where $\alpha_{Afast}$ and the $\alpha_{Aslow}$ could be set to a plurality of different values, for example, could be set to slightly different values or same value for each band; wherein, preferably, $\alpha_{Afast}$ is set to one half of $\alpha_{Aslow}$, or even smaller, to create a potentially more natural listening experience during dramatic scene switch.

Next, at 324, the time constants, such as, the attack time constant $\alpha_A$ in Equation (11) is applied to guide the smoothing to $D_b[n]$, as represented in Equations (12) and (13), respectively:

$$D_b[n]=\begin{cases}\alpha_A D_b[n-1]+(1-\alpha_A)d_b[n], & d_b[n]\geq D_b[n-1]\\ \alpha_R D_b[n-1]+(1-\alpha_R)d_b[n], & \text{otherwise}\end{cases}\qquad(12)$$

$$D_b[n]=\begin{cases}d_b[n], & d_b[n]\geq D_b[n-1]\\ \alpha_R D_b[n-1]+(1-\alpha_R)d_b[n], & \text{otherwise}\end{cases}\qquad(13)$$

Where $d_b[n]$ is the unsmoothed per-band limit threshold generated in DAM. In some implementations, the Equation (12) illustrates the regular fast-attack/slow-release smoothing to $D_b[n]$; in addition, if the most rapid changes are needed, the $\alpha_A$ and the $\alpha_{Afast}$ could even be set as zero; in this case, the DAM is guided to apply no smoothing when a scene switch is detected during an attack of $d_b[n]$, as represented in Equation (13).

Figure 5:
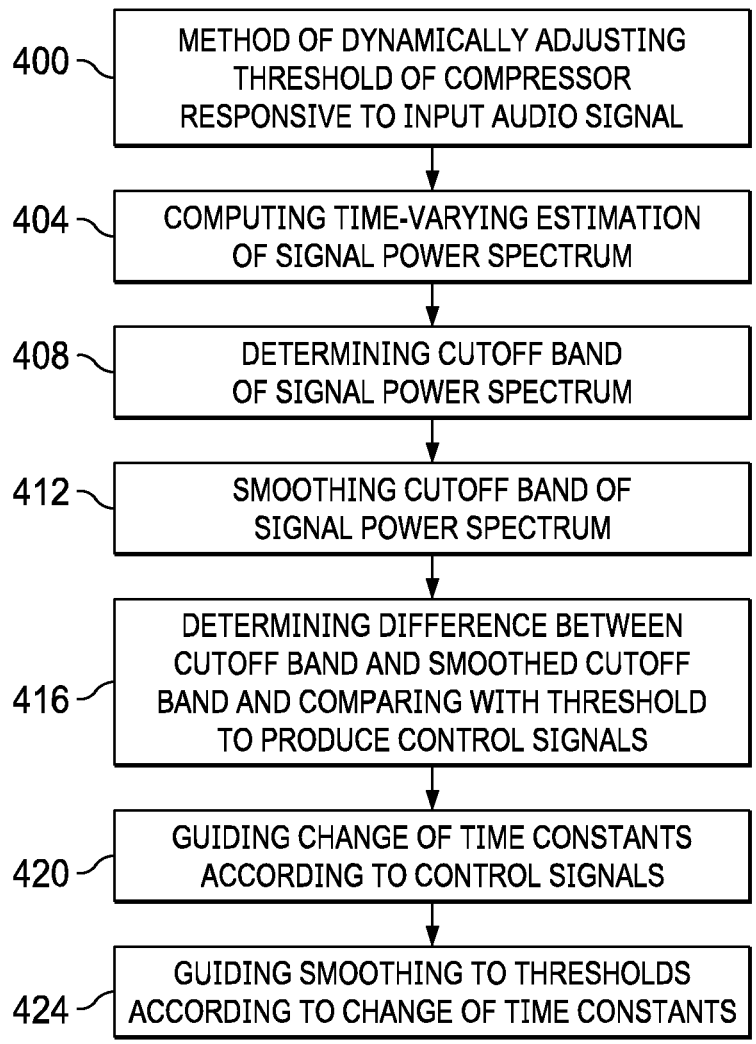
FIG. 5 shows another example of a method 400 of dynamically adjusting thresholds of the compressor responsive to in input audio signal based on determining whether a scene switch has occurred in the input audio signal, performed according to some implementations.

In addition to or instead of utilizing the centroid as represented in FIG. 4, other characteristics of the input signal spectrum could be leveraged to assist the detection of scene switch as well. FIG. 5 shows another example of a method 400 of dynamically adjusting thresholds of the compressor responsive to an input audio signal based on determining whether a scene switch has occurred in the input audio signal, performed according to some implementations. In this exemplary embodiment, the cutoff band of the signal power spectrum could be an alternative indicator of the scene switch cases, preferably, the cutoff band could be a good indicator of introduction of the music instruments that features different bandwidths. At 404, the signal power spectrum may be estimated by smoothing the per-band signal with a fast-attack/slow-release one pole smoother and then represented in dB, as represented similarly in Equation (6). Next, at 408, the cutoff band of the signal power spectrum $b_{cutoff}[n]$ is determined by the estimated signal power spectrum, as represented in Equation (14):

$$b_{cutoff}[n] = \min_b\{b \mid S_b[n] < \text{Threshold}\} \quad (14)$$

Then, at 412, the cutoff band of the signal power spectrum would also be smoothed with a fast-attack/slow-release one pole smoother to obtain the smoothed version cutoff band $b_{cutoff}[n]$, as represented similarly in Equation (9). Next, at 416, the difference between the cutoff band and the smoothed cutoff band is determined and then compared with the threshold to produce one or more control signals $C_k[n]$, as represented similarly in Equation (10). At 420, $C_k[n]$ guides the change of the time constants, as represented similarly in Equation (11). Next, at 424, the time constants could be applied to guide the smoothing to $D_b[n]$, as represented similarly in Equations (12) and (13).

Figure 6A:
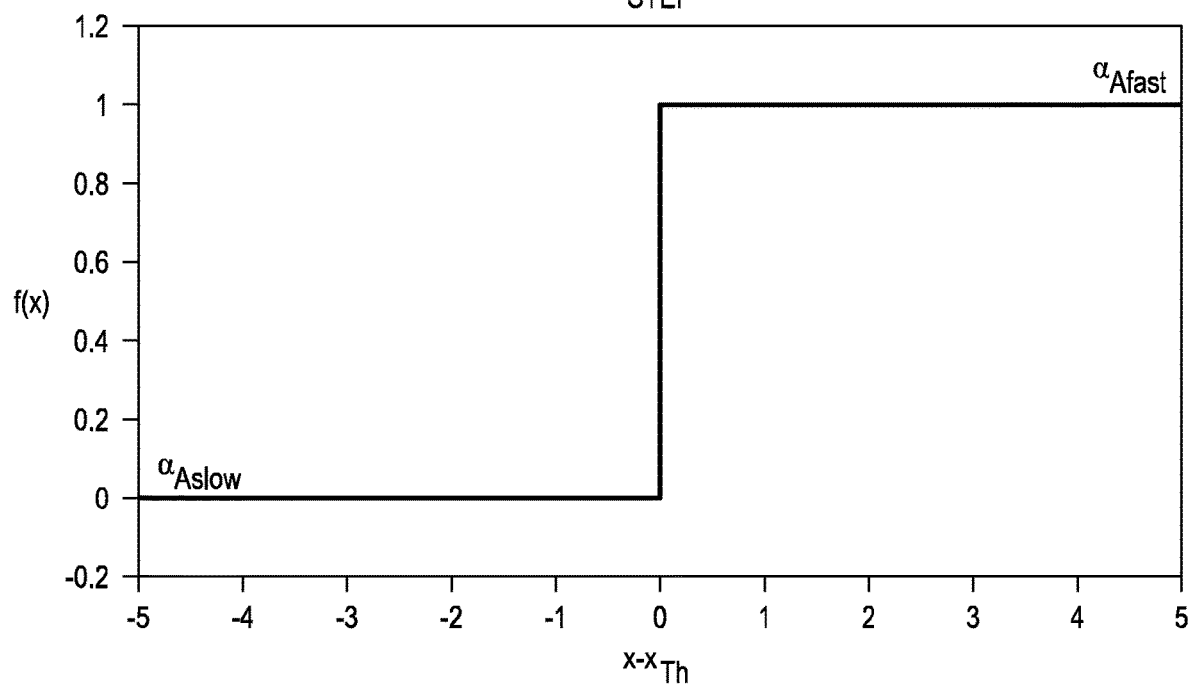
FIGS. 6A and 6B show two examples of the function of one or more control signals, i.e., step function and sigmoid function, respectively, according to some implementations.
Figure 6B:
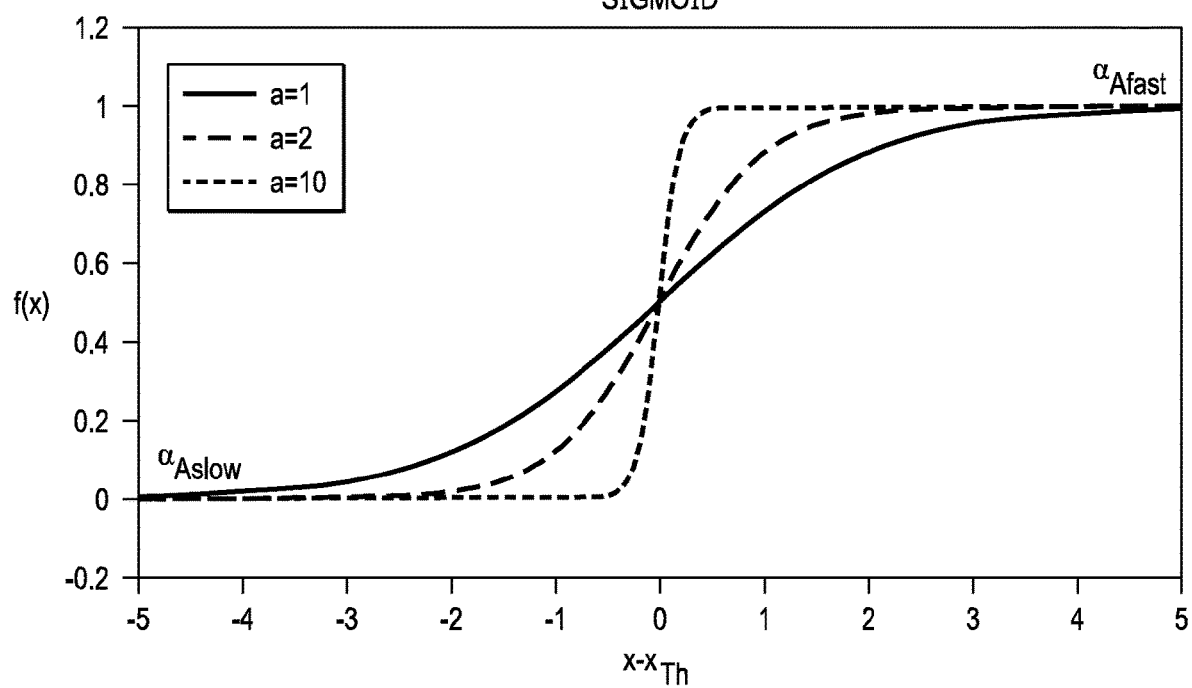

FIGS. 6A and 6B show two examples of the function of one or more control signals $C_k[n]$, i.e., step function and sigmoid function, respectively, according to some implementations. Generally, the function $f_{(.)}$ of the control signals $C_k[n]$ could be mapped to the range [0, 1]. In one embodiment as illustrated by FIG. 6A, the mapping function $f_{(.)}$ would be a very simple example, i.e., the step function, as represented in Equation (15):

$$f(x) = \begin{cases} 0, & x - x_{TH} < 0 \\ 1, & \text{otherwise} \end{cases} \quad (15)$$

Where $x_{Th}$ is the threshold. In addition, in the other preferable embodiment as illustrated by FIG. 6B, the mapping function $f_{(.)}$ would be the sigmoid function as represented in Equation (16):

$$f(x) = \frac{1}{1 + e^{-(x - x_{Th})/a}} \quad (16)$$

Where $x_{Th}$ is the threshold and a is a scale factor. FIG. 6B further shows the three specific embodiments of the Sigmoid function where the scale factor is set as 1, 2 and 10 respectively. Using the sigmoid function could potentially assist to generate more consistent audio outputs across floating point and fixed point platforms with different word lengths.

Instead of guiding the attack time constant, an alternative is that one or more control signals $C_k[n]$ could be created to guide the other parameters, such as the release time constant an, etc., by following the generate steps from 304/404 to 320/420 described above; wherein some of parameters used in steps from 304/404 to 320/420 could be changed, such as changing the smoothing scheme, by changing the time constants used, of the signal power spectrum Sb[n] at 312/412, or changing the mapping function at 316/416, etc.

The techniques of the scene switch analyzer described herein could be implemented by one or more computing devices. For example, a controller of a special-purpose computing device may be hard-wired to perform the disclosed operations or cause such operations to be performed and may include digital electronic circuitry such as one or more application-specific integrated circuits (ASICs) or field programmable gate arrays (FPGA) persistently programmed to perform operations or cause operations to be performed. In some implementations, custom hard-wired logic, ASICs and/or FPGAs with custom programming are combined to accomplish the techniques.

In some other implementations, a general purpose computing device could include a controller incorporating a central processing unit (CPU) programmed to cause one or more of the disclosed operations to be performed pursuant to program instruction in firmware, memory, other storage, or a combination thereof.

The term "computer-readable storage medium" as used herein refers to any medium that storage instructions and/or data that cause a computer or type of machine to operate in a specific fashion. Any of the models, analyzer and operations described herein may be implemented as or caused to be implemented by software code executable by a processor of a controller using suitable computer language. The software code may be stored as a series of instructions on a computer-readable medium for storage. Example of suitable computer-readable storage medium include random access memory (RAM), read only memory (ROM), a magnetic medium, optical medium, a solid state drive, flash memory, and any other memory chip or cartridge. The computer-readable storage medium may be any combination of such storage devices. Any such computer-readable storage medium may reside on or within a single computing device or an entire computer system, and may be among other computer-readable storage medium within a system or network.

While the subject matter of this application has been particularly shown and described with reference to implementations thereof, it will be understood by those skilled in the art that changes in the form and details of the disclosed implementations may be made without departing from the spirit or scope of this disclosure. Examples of some of these implementations are illustrated in the accompany drawings, and specific details are set forth in order to provide a thorough understanding thereof. It should be noted that implementations may be practiced without some or all of these specific details. In addition, well known features may not have been described in detail to promote clarity. Finally, although advantages have been discussed herein with reference to some implementations, it will be understood that the scope should not be limited by reference to such advantages. Rather, the scope should be determined with reference to the appended claims.

Various aspects of the present invention may be appreciated from the following enumerated example embodiments (EEEs):

EEE1. A method of dynamically adjusting thresholds of a compressor responsive to an input audio signal, the method comprising:
  receiving, by a scene switch analyzer, an input audio signal having a plurality of frequency band components;
  determining, by a scene switch analyzer whether a scene switch has occurred in the input audio signal;
  processing the frequency band components of the input audio signal, including:
    in response to determine that scene switch has not occurred, applying slow smoothing to compressor thresholds of the frequency band components; and
    in response to determine that scene switch has occurred, applying fast smoothing or no smoothing to the compressor thresholds of the frequency band components.
EEE2. The method of EEE 1, wherein the scene switch includes a switch between a broadband signal and a narrowband signal, or vice versa.
EEE3. The method of EEE 2, wherein the broadband signal corresponds to a vocal sound, and the narrowband signal corresponds to an instrumental sound.
EEE4. The method of EEE 3, wherein the instrumental sound is a piano sound.
EEE5. The method of EEE 2, wherein the broadband signal corresponds to a professional movie content, and the narrowband signal corresponds to a low-quality narrowband UGC content.
EEE6. The method of any of EEEs 1-5, wherein determining whether a scene switch has occurred in the input audio signal is based on all frequency band components of an input audio signal.
EEE7. The method of EEE 6, wherein determining whether a scene switch has occurred in the input audio signal is based on a time-varying estimation of a signal power spectrum centroid.
EEE8. The method of EEE 7, wherein the scene switch analyzer computes the time-varying estimation of the signal power spectrum centroid at least by performing operations comprising:
  estimating a signal power spectrum by smoothing each frequency band component signal; and
  determining the centroid of the signal power spectrum using the estimated signal power spectrum.
EEE9. The method of EEE 8, wherein determining whether the scene switch has occurred in the input audio signal comprises:
  smoothing the centroid;
    determining a difference between the centroid and the smoothed centroid; and
    determining whether the scene switch has occurred based on whether the difference satisfied a threshold.
EEE10. The method of any of EEEs 6-9, wherein determining whether a scene switch has occurred in the input audio signal is based on the estimation of the cutoff band of the signal power spectrum.
EEE11. The method of EEE 10, wherein the scene switch analyzer computes the estimation of the cutoff band of the signal power spectrum at least by performing operations comprising:
  estimating a signal power spectrum by smoothing each frequency band component signal; and
  determining the cutoff band of the signal power spectrum using the estimated signal power spectrum.
EEE12. The method of EEE 11, wherein determining whether the scene switch has occurred in the input audio signal comprises:
  smoothing the cutoff band;
    determining a difference between the cutoff band and the smoothed cutoff band; and
    determining whether the scene switch has occurred based on whether the difference satisfies a threshold.
EEE13. The method of any of the preceding EEEs, wherein the scene switch analyzer provides one or more control signals to the distortion audibility model to guide the smoothing to compressor thresholds of the frequency band components of the input audio signal after determining whether the scene switch has occurred.
EEE14. The method of EEE 13, wherein one or more control signals guide the change of the time constants including attack time constant and/or release time constant.
EEE15 The method of EEE 13 or 14, wherein the function of one or more control signals is mapped to the range [0, 1].
EEE16. The method of EEE 15, wherein the mapping function is the step function or the sigmoid function.
EEE17. A scene switch analyzer comprising:
  one or more computing devices; and
  a computer-readable storage medium storing instructions that, when executed by one or more processors, cause the one or more processors to perform operations of any one of EEEs 1 to 16.
EEE18. A computer-readable storage medium storing instructions that, when executed by one or more computing devices, cause the one or more computing devices to perform operations of any one of EEEs 1 to 16.
EEE19. Computer program product having instructions which, when executed by a computing device or system, cause said computing device or system to execute the method of any of EEEs 1-16.

It is claimed:

1. A method of dynamically adjusting thresholds of a compressor responsive to an input audio signal, the method comprising:
  receiving, by a scene switch analyzer, an input audio signal having a plurality of frequency band components;
  determining, by the scene switch analyzer, whether a scene switch has occurred in the input audio signal, wherein a scene switch is determined to have occurred when the input audio signal transitions from being a broadband signal to being a narrowband signal or vice versa;
  providing, by the scene switch analyzer, one or more control signals to a distortion audibility model to guide smoothing to compressor thresholds of the frequency band components by guiding a change of an attack time constant and/or a release time constant of a smoother; and
  processing the frequency band components of the input audio signal, including:
    in response to determining that scene switch has not occurred, the one or more control signals indicating use of a large time constant thereby applying slow smoothing to the compressor thresholds of the frequency band components; and
    in response to determining that scene switch has occurred, the one or more control signals indicating use of a small or zero-valued time constant thereby applying fast smoothing or no smoothing to the compressor thresholds of the frequency band components.

2. The method of claim 1, wherein the broadband signal corresponds to a vocal sound or a professional movie content, and the narrowband signal corresponds to an instrumental sound or a low-quality narrowband user-generated content (UGC).

3. The method of claim 1, wherein determining whether a scene switch has occurred in the input audio signal is based on all frequency band components of an input audio signal.

4. The method of claim 3, wherein determining whether a scene switch has occurred in the input audio signal is based on a time-varying estimation of a signal power spectrum centroid.

5. The method of claim 4, wherein the scene switch analyzer computes the time-varying estimation of the signal power spectrum centroid at least by performing operations comprising:
   estimating a signal power spectrum by smoothing each of the frequency band components; and
   determining the centroid of the signal power spectrum using the estimated signal power spectrum.

6. The method of claim 5, wherein determining whether the scene switch has occurred in the input audio signal comprises:
   smoothing the centroid to generate a smoothed centroid;
   determining a difference between the centroid and the smoothed centroid; and
   determining whether the scene switch has occurred based on whether the difference satisfied a threshold.

7. The method of claim 3, wherein determining whether a scene switch has occurred in the input audio signal is based on an estimation of a cutoff band of a signal power spectrum.

8. The method of claim 7, wherein the scene switch analyzer computes the estimation of the cutoff band of the signal power spectrum at least by performing operations comprising:
   estimating a signal power spectrum by smoothing each frequency band component signal; and
   determining the cutoff band of the signal power spectrum using the estimated signal power spectrum.

9. The method of claim 8, wherein determining whether the scene switch has occurred in the input audio signal comprises:
   smoothing the cutoff band to generate a smoothed cutoff band;
   determining a difference between the cutoff band and the smoothed cutoff band; and
   determining whether the scene switch has occurred based on whether the difference satisfies a threshold.

10. The method of any one of the preceding claims, wherein a function of one or more control signals for guiding the change of the attack time constant and/or the release time constant is mapped to a range [0, 1], and wherein said attack time constant and/or release time constant is changed by being multiplied by said function.

11. The method of claim 1, further comprising:
   performing, by the compressor, on each of the frequency band components, a compression operation having the corresponding threshold to produce a plurality of gains, each of the gains corresponding to a respective frequency band component.

12. A scene switch analyzer comprising:
   one or more computing devices; and
   a computer-readable storage medium storing instructions that, when executed by one or more processors, cause the one or more processors to perform the method of claim 1.

13. A non-transitory computer-readable storage medium storing instructions that, when executed by one or more computing devices, cause the one or more computing devices to perform the method of claim 1.

* * * * *

UNITED STATES PATENT AND TRADEMARK OFFICE
CERTIFICATE OF CORRECTION

PATENT NO. : 11,282,533 B2
APPLICATION NO. : 17/281006
DATED : March 22, 2022
INVENTOR(S) : Yuanxing Ma Page 1 of 1

It is certified that error appears in the above-identified patent and that said Letters Patent is hereby corrected as shown below:

In the Claims

Column 12, Claim 8, Line 1, delete "a" and insert --the--.

Column 12, Claim 8, Line 1, after "each", insert --of the--.

Column 12, Claim 8, Line 2, delete "component signal;" and insert --components;--.

Signed and Sealed this
Fourth Day of March, 2025

Coke Morgan Stewart
*Acting Director of the United States Patent and Trademark Office*